US011969858B2

United States Patent
Namiki et al.

(10) Patent No.: US 11,969,858 B2
(45) Date of Patent: Apr. 30, 2024

(54) SUBSTRATE PROCESSING APPARATUS

(71) Applicant: EBARA CORPORATION, Tokyo (JP)

(72) Inventors: Keisuke Namiki, Tokyo (JP); Makoto Fukushima, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 1181 days.

(21) Appl. No.: 16/499,576

(22) PCT Filed: Jan. 16, 2018

(86) PCT No.: PCT/JP2018/000912
§ 371 (c)(1),
(2) Date: Sep. 30, 2019

(87) PCT Pub. No.: WO2018/179685
PCT Pub. Date: Oct. 4, 2018

(65) Prior Publication Data
US 2020/0023487 A1 Jan. 23, 2020

(30) Foreign Application Priority Data
Mar. 31, 2017 (JP) .................................. 2017-071573

(51) Int. Cl.
*B24B 37/30* (2012.01)
*B23Q 15/16* (2006.01)
(Continued)

(52) U.S. Cl.
CPC .............. *B24B 37/30* (2013.01); *B23Q 15/16* (2013.01); *B24B 49/10* (2013.01); *H01L 21/30625* (2013.01); *H01L 22/26* (2013.01)

(58) Field of Classification Search
CPC ....... B24B 37/30; B24B 37/32; B24B 37/005; B24B 37/042; B24B 49/10; B24B 49/16;
(Continued)

(56) References Cited

U.S. PATENT DOCUMENTS 6,242,353 B1   6/2001 Kobayashi et al.
6,435,956 B1*  8/2002 Ohwada .................. B24B 49/10
                                                          451/41
(Continued)

FOREIGN PATENT DOCUMENTS

CN   102802871 A   11/2012
JP   2001-009712 A   1/2001
(Continued)

OTHER PUBLICATIONS

PE2E Translation KR-20160110866-A; Son, Jun Ho; Carrier Head of Chemical Mechanical Polishing Apparatus; Sep. 22, 2016 (Year: 2016).*

(Continued)

*Primary Examiner* — Laura C Guidotti
*Assistant Examiner* — Sidney D Full
(74) *Attorney, Agent, or Firm* — BakerHostetler

(57) ABSTRACT

A substrate processing apparatus includes a substrate polishing unit 40 having a polishing pad for polishing a wafer W, and a top ring 41 for holding a wafer and pressing the wafer against the polishing pad. An elastic membrane 80 for holding a surface opposite to a polishing surface of the wafer W is attached to the top ring 41 as a consumable. The elastic membrane 80 is provided with a plurality of strain sensors 85 and 86 for measuring strain occurring in the elastic membrane 80 during polishing, and data of an amount of strain is read to a control device 15 by detection units 90 and 91. The control device 15 sets a processing condition such as a polishing recipe for the wafer W based on strain information of the elastic membrane 80 measured by the strain sensors.

5 Claims, 13 Drawing Sheets

(51) Int. Cl.
*B24B 49/10* (2006.01)
*H01L 21/306* (2006.01)
*H01L 21/66* (2006.01)

(58) Field of Classification Search
CPC ......... B24B 7/228; B24B 49/08; B24B 37/04; B24B 37/10; H01L 21/30625; H01L 22/26

See application file for complete search history.

(56) References Cited

U.S. PATENT DOCUMENTS

| | | | |
|---|---|---|---|
| 9,073,170 | B2 | 7/2015 | Fukushima et al. |
| 9,254,545 | B2* | 2/2016 | Park .................... B24B 37/005 |
| 9,403,256 | B2 | 8/2016 | Yavelberg |
| 2002/0037681 | A1 | 3/2002 | Gitis et al. |
| 2004/0029333 | A1 | 2/2004 | Matsukawa |
| 2006/0014475 | A1 | 1/2006 | Sekiya |
| 2006/0292967 | A1 | 12/2006 | Torii et al. |
| 2007/0243795 | A1* | 10/2007 | Kobayashi ............. B24B 49/10 451/5 |
| 2008/0004743 | A1* | 1/2008 | Goers ................. B24B 53/017 700/121 |
| 2008/0304929 | A1 | 12/2008 | Fischer |
| 2009/0053983 | A1 | 2/2009 | Hosaka et al. |
| 2012/0058709 | A1 | 3/2012 | Fukushima et al. |
| 2013/0052917 | A1 | 2/2013 | Park |
| 2014/0011305 | A1 | 1/2014 | Nakamura |
| 2014/0020829 | A1 | 1/2014 | Chen et al. |
| 2014/0138355 | A1 | 5/2014 | Yavelberg |
| 2014/0342640 | A1* | 11/2014 | Fukushima ............ B24B 37/30 451/24 |
| 2015/0347793 | A1 | 12/2015 | Hsiao et al. |
| 2015/0360343 | A1 | 12/2015 | Yavelberg |

FOREIGN PATENT DOCUMENTS

| | | | |
|---|---|---|---|
| JP | 2002-219645 A | | 8/2002 |
| JP | 2008-310404 A | | 12/2008 |
| JP | 2008310404 A | * | 12/2008 |
| JP | 2009-542449 A | | 12/2009 |
| JP | 2011-194509 A | | 10/2011 |
| JP | 2013-052483 A | | 3/2013 |
| JP | 2014-011432 A | | 1/2014 |
| JP | 2014-223684 A | | 12/2014 |
| JP | 2015-051501 A | | 3/2015 |
| JP | 2016-207862 A | | 12/2016 |
| KR | 2001-0024969 A | | 3/2001 |
| KR | 2007-0017973 A | | 2/2007 |
| KR | 2013-0012013 A | | 1/2013 |
| KR | 20160110866 A | * | 9/2016 ........... B24B 41/002 |
| TW | 200610615 A | | 4/2006 |
| TW | 200744787 A | | 12/2007 |
| TW | 200819243 A | | 5/2008 |
| TW | 201143980 A | | 12/2011 |
| TW | 201404530 A | | 2/2014 |
| TW | 201422367 A | | 6/2014 |
| TW | 201600235 A | | 1/2016 |
| TW | 201608657 A | | 3/2016 |
| WO | WO 2000/045993 A1 | | 8/2000 |

OTHER PUBLICATIONS

International Patent Application No. PCT/JP2018/000912; Int'l Search Report; dated Mar. 13, 2018; 2 pages.

Singapore Patent Application No. 11201908780R; Written Opinion and Search Report; dated Oct. 15, 2020; 11 pages.

* cited by examiner

FIG.15
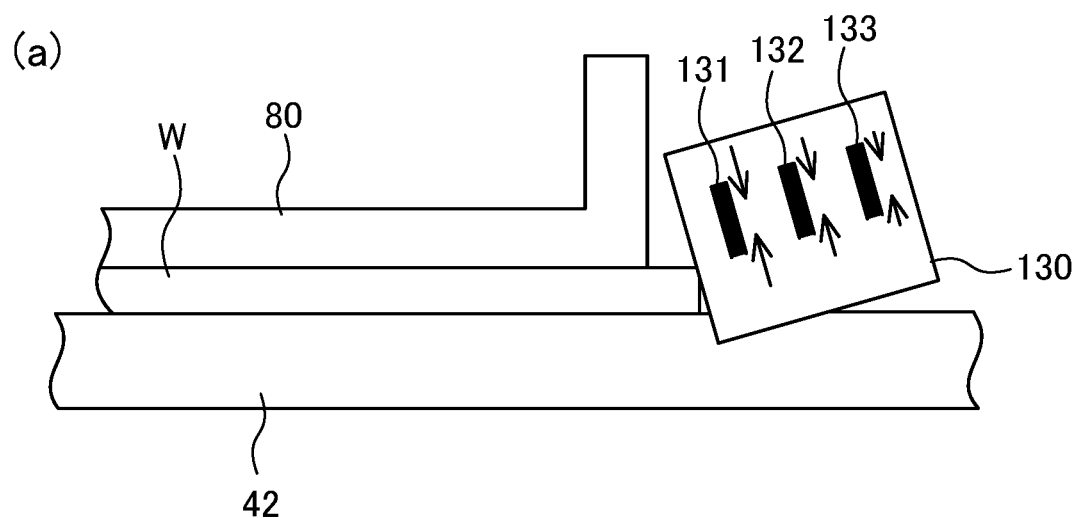
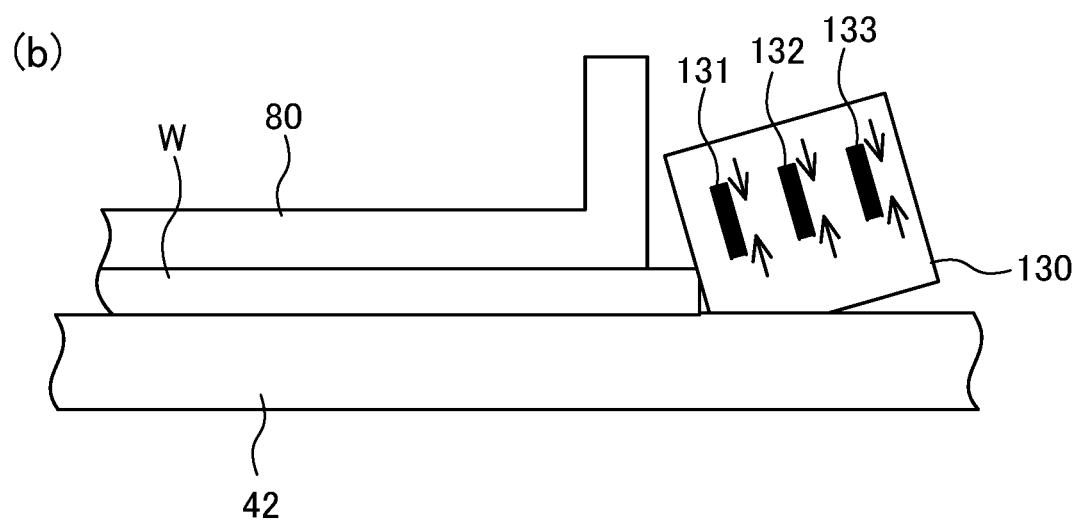

SUBSTRATE PROCESSING APPARATUS

TECHNICAL FIELD

The present invention relates to a substrate processing apparatus for processing the surface of a substrate such as a semiconductor wafer.

BACKGROUND ART

Consumables such as a polishing pad are used in substrate processing apparatus such as a substrate polishing apparatus for polishing a substrate such as a semiconductor wafer and a substrate cleaning device for cleaning the surface of a substrate. There is known a polishing apparatus in which RF tags recorded with information on the types and characteristics of these consumables are attached to the consumables and these pieces of information are read when the device is used (see Patent Literature 1).

Furthermore, Patent Literature 2 discloses a polishing apparatus in which when a consumable such as a polishing pad is removed from the device, memory information of an RF tag is erased to prevent leakage of information, and when occurrence of an abnormality is detected by an abnormality monitoring unit, information on the abnormality is written in an RF tag.

CITATION LIST

Patent Literature

Patent Literature 1: Japanese Patent Laid-Open No. 2002-219645
Patent Literature 2: Japanese Patent Laid-Open No. 2008-310404

SUMMARY OF INVENTION

Technical Problem

Following enhancement in integration and increase in density of semiconductor devices, wirings of circuits are increasingly finer and the number of layers of multilayer wirings is also increasing, so that planarization of the surfaces of semiconductor devices in manufacturing processes is becoming increasingly important. Consumables used in substrate processing apparatus are easily worn or deformed due to repeated substrate processing, and if substrate processing conditions such as polishing pressure fluctuate, the film thickness of a substrate after polishing processing fluctuates or a trouble such as defective polishing may occur in some cases. Therefore, in order to make the conditions of substrate processing constant, it is desirable to more accurately detect the situations of consumables used for the substrate processing.

The present invention has been made in view of the foregoing, and has an object to provide a substrate processing apparatus capable of making conditions of substrate processing constant by detecting the situations of consumables used for substrate processing more accurately.

Solution to Problem

An aspect of the present invention is a substrate processing apparatus for processing a substrate that is characterized by comprising: a consumable to be used in the substrate processing apparatus; at least one sensor that is fitted to the consumable, measures a physical quantity of the consumable, and includes a storage unit for storing the physical quantity and a communication unit; a detector that is provided in a neighborhood of the consumable and reads and writes information from and into the sensor fitted to the consumable; and a control device that is connected to the detector and sets a processing condition in the substrate processing apparatus based on the physical quantity of the consumable read from the sensor.

In the substrate processing apparatus according to the present invention, it is preferable that identification information of the sensor is stored in the storage unit, and the control device determines based on the identification information read from the sensor whether it is possible to drive the substrate processing apparatus to which the consumable is attached. Furthermore, it is preferable that when an abnormality occurs in the substrate processing apparatus, the control device records information on a processing condition of the substrate into the storage unit in the sensor.

The substrate processing apparatus according to an embodiment of the present invention is a substrate polishing apparatus including a polishing pad for polishing the substrate, and a substrate holding unit for holding the substrate and pressing the substrate against the polishing pad, the consumable is an elastic membrane that is attached to the substrate holding unit and holds a surface opposite to a polishing surface of the substrate, the sensor is a strain sensor for measuring strain of the elastic membrane, and the control device can set a processing condition in the substrate processing apparatus based on strain information of the elastic membrane measured by the strain sensor.

In the foregoing substrate polishing apparatus, it is preferable that at least one pressure chamber is formed between the elastic membrane and the substrate holding unit, and the control device adjusts pressure in the pressure chamber based on the strain information of the elastic membrane measured by the strain sensor. There is a case where an elastic membrane does not swell in the same way even under application of the same internal pressure and the pressure applied to the substrate varies depending on an individual elastic membrane due to manufacturing variation of the elastic membrane and variation in physical property of raw material lot. However, by adjusting the pressure as described above, it is possible to cancel this variation.

It is preferable that the foregoing substrate polishing apparatus includes a jetting unit for jetting gas or liquid to the elastic membrane holding the substrate to peel the polished substrate from the elastic membrane, and the control device adjusts pressure in the pressure chamber based on the strain information of the elastic membrane so that the gas or the liquid from the jetting unit is jetted to a boundary between the elastic membrane and the substrate. As a result, the gas or the liquid can be effectively jetted to the boundary between the elastic membrane and the substrate.

It is preferable that the jetting unit is configured so that a jetting angle of the gas or the liquid is adjustable, and the substrate processing apparatus includes: an imaging unit for imaging a boundary portion between the elastic membrane and the substrate; an image processing unit for detecting a position of the boundary portion from an image obtained by the imaging unit; and a jetting angle adjustment unit for determining an jetting angle by the jetting unit based on the position of the boundary portion detected by the image processing unit to adjust the jetting angle.

It is preferable that the substrate processing apparatus according to the embodiment of the present invention is a substrate polishing apparatus including a polishing pad for polishing the substrate, and a substrate holding unit for holding the substrate and pressing the substrate against the polishing pad, the consumable is a retainer ring for supporting an outer periphery of the substrate, the sensor is a plurality of strain sensors for measuring strain of the retainer ring, and the control device detects whether variation in strain amount detected by the plurality of strain sensors is within a predetermined value.

At an initial stage of use of the substrate polishing apparatus or immediately after the retainer ring is replaced, the shape of the contact surface of the retainer ring does not follow the polishing surface of the polishing pad, and variation occurs in the contact way of the retainer ring against the polishing surface, so that variation also occurs in compression force applied in the vertical direction of the retainer ring depending on the position of the retainer ring. Therefore, variation also occurs in the strain amounts detected by the plurality of strain sensors provided in the retainer ring. However, when break-in of the retainer ring is completed, the shape of the contact surface of the retainer ring follows the polishing surface of the pad, so that the variation in strain amounts detected by the plurality of strain sensors is reduced. As a result, it is possible to effectively detect the completion of the break-in of the retainer ring.

The substrate processing apparatus according to the embodiment of the present invention is a substrate polishing apparatus including a polishing pad for polishing the substrate, and a substrate holding unit for holding the substrate and pressing the substrate against the polishing pad, the consumable is a retainer ring for supporting an outer periphery of the substrate, the sensor is a plurality of strain sensors for measuring strain of the retainer ring, and the control device changes a processing condition of the substrate according to a distribution of an amount of the strain detected by the plurality of strain sensors.

Advantageous Effect of Invention

According to the present invention, the sensor for measuring the physical quantity of the consumable used in the substrate processing apparatus is fitted to the consumable, and a processing condition in the substrate processing apparatus is determined based on the physical quantity of the consumable read from the sensor. Therefore, the state of the consumable used for substrate processing can be detected more accurately, and the substrate processing performance can be made uniform.

BRIEF DESCRIPTION OF DRAWINGS

FIG. 15 is an explanatory diagram showing a state of break-in (running-in) of the retainer ring in the example of FIG. 14.

DESCRIPTION OF EMBODIMENT

Figure 1:
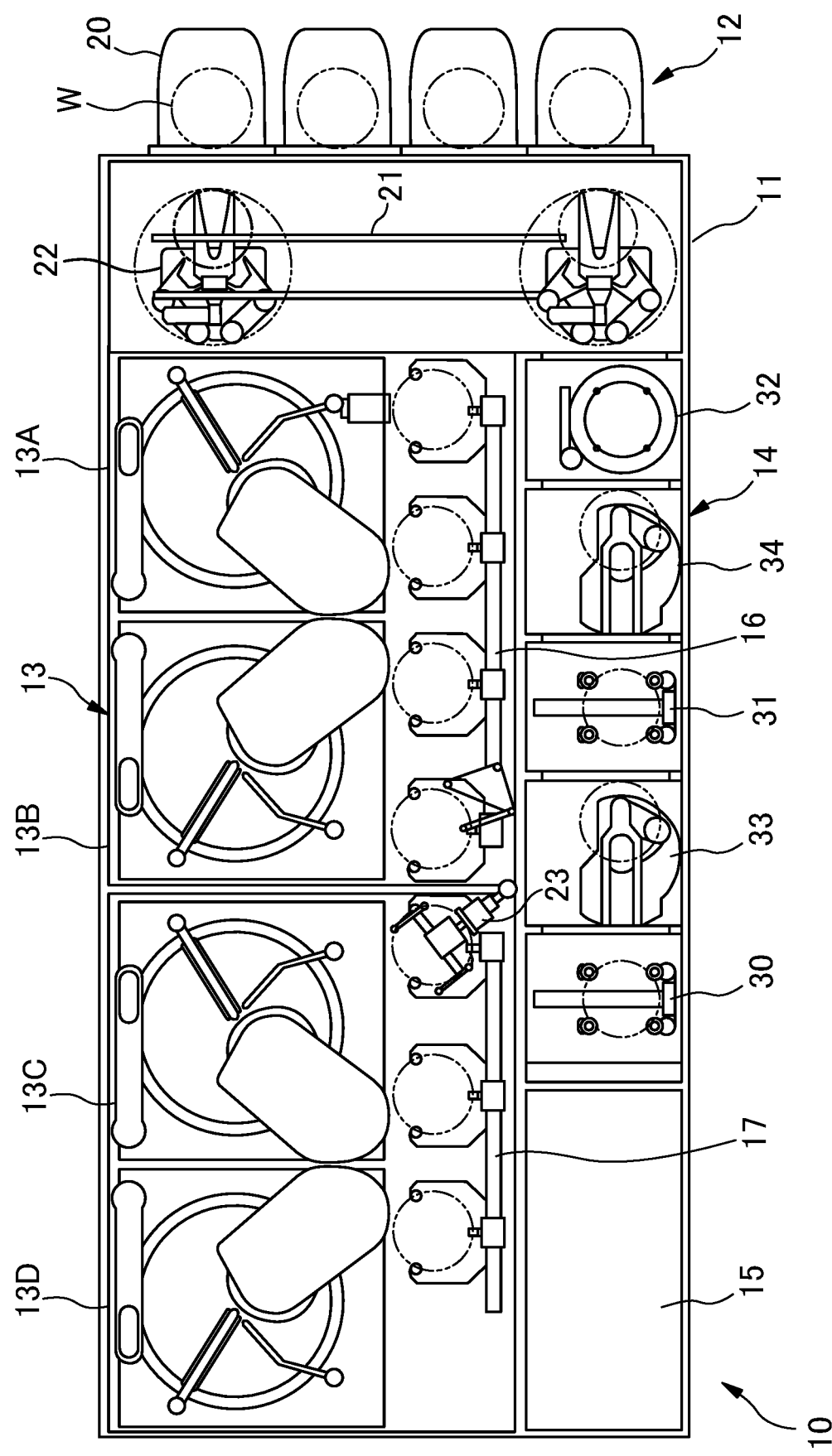
FIG. 1 is a plan view schematically showing a configuration of a substrate processing apparatus according to an embodiment of the present invention.

Hereinafter, a substrate processing apparatus according to an embodiment of the present invention will be described with reference to the drawings. Note that the same or corresponding components are represented by the same reference numerals and duplicative description thereon are omitted.

FIG. 1 is a plan view showing an overall configuration of the substrate processing apparatus. The substrate processing apparatus 10 is divided into a loading/unloading section 12, a polishing section 13, and a cleaning section 14, which are provided inside a rectangular housing 11. The substrate processing apparatus 10 also includes a control device 15 for performing control of the operation of processing such as substrate transportation, polishing, and cleaning.

The loading/unloading section 12 includes a plurality of front loading units 20, a traveling mechanism 21, and two transporting robots 22. A substrate cassette in which many substrates (substrates) are stocked is mounted in the front loading unit 20. The transporting robot 22 is provided with two hands at upper and lower sides, and moves on the traveling mechanism 21 to perform an operation of taking out a substrate W from the substrate cassette in the front loading unit 20 and sending the substrate W to the polishing section 13 and also returning a processed substrate sent from the cleaning section 14 to the substrate cassette.

The polishing section 13 is an area in which polishing (planarizing processing) is performed on a substrate, and a plurality of polishing units 13A to 13D are provided in the polishing section 13, and arranged along a longitudinal direction of the substrate processing apparatus. Each polishing unit has a top ring for polishing a substrate W on a polishing table while pressing the substrate W against a polishing pad, a polishing liquid supply nozzle for supplying a polishing liquid and a dressing liquid to the polishing pad, a dresser for dressing a polishing surface of the polishing pad, and an atomizer for spraying a mixed fluid of liquid and gas or a misty liquid onto the polishing surface to wash away polishing scrap and abrasive grains remaining on the polishing surface.

First and second linear transporters 16 and 17 are provided between the polishing section 13 and the cleaning section 14 as transport mechanisms for transporting the substrate W. The first linear transporter 16 is freely movable among a first position where the first linear transporter 16 receives a substrate W from the loading/unloading section 12, second and third positions where the first linear transporter 16 receives and delivers a substrate W from and to the polishing units 13A and 13B respectively, and a fourth position where the first linear transporter 16 receives and delivers a substrate W from and to the second linear transporter 17.

The second linear transporter 17 is freely movable among a fifth position where the second linear transporter 17 receives a substrate W from the first linear transporter 16, and sixth and seventh positions where the second linear transporter 17 receives and delivers a substrate W from and to the polishing units 13C and 13D, respectively. A swing transporter 23 is provided between the transporters 16 and 17 to transfer a substrate W to the cleaning section 14.

The cleaning section 14 includes a first substrate cleaning device 30, a second substrate cleaning device 31, a substrate drying device 32, and transporting robots 33 and 34 for receiving and delivering a substrate among these devices. A substrate W which has been subjected to polishing processing in the polishing unit is cleaned (primary cleaning) by the first substrate cleaning device 30, and then further cleaned (finish cleaning) by the second substrate cleaning device 31. The substrate which has been cleaned is transported from the second substrate cleaning device 31 to the substrate drying device 32 and subjected to spin drying. The substrate W which has been dried is returned to the loading/unloading section 12.

Figure 2:
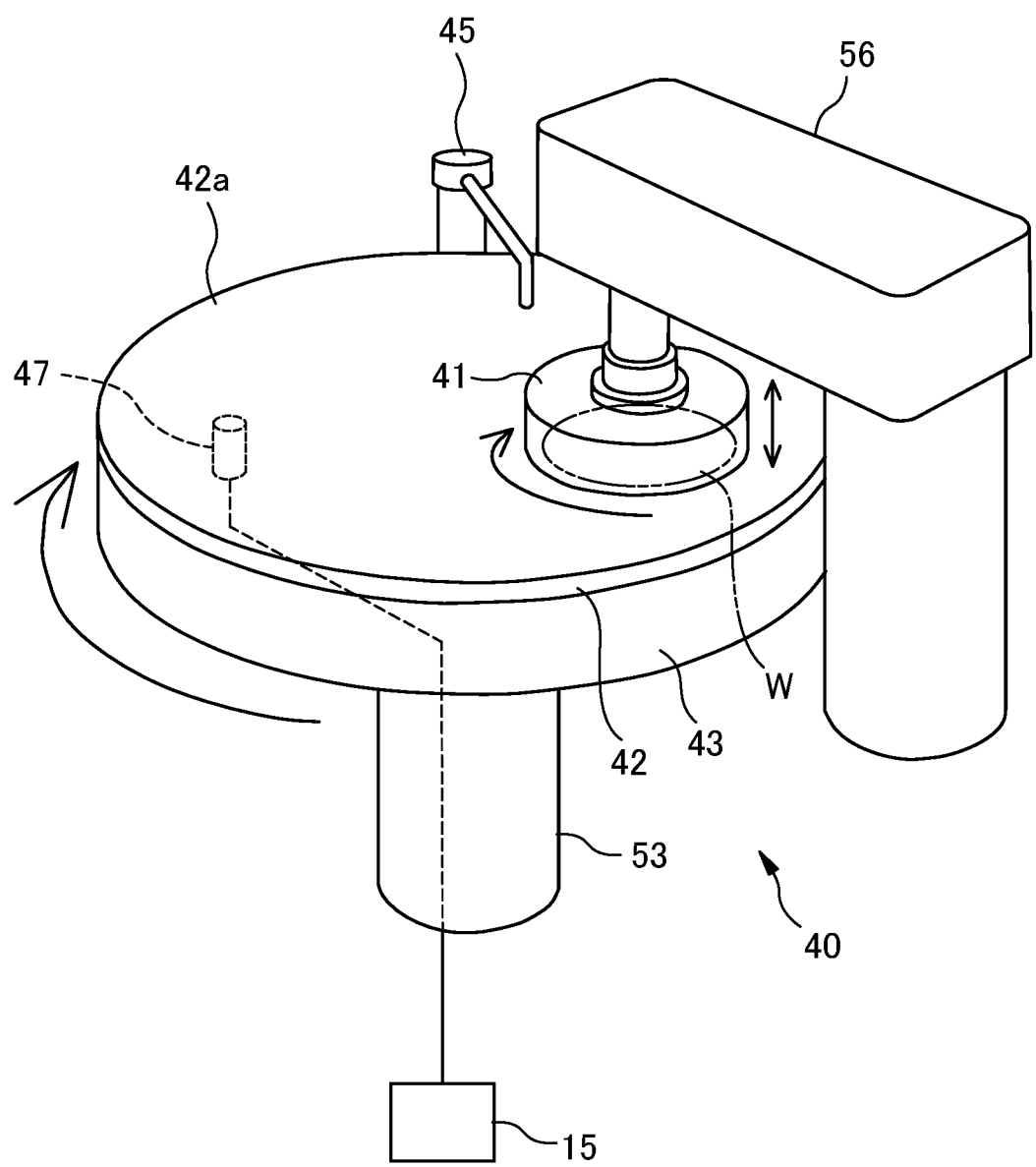
FIG. 2 is a perspective view schematically showing an embodiment of a substrate polishing unit.
Figure 3:
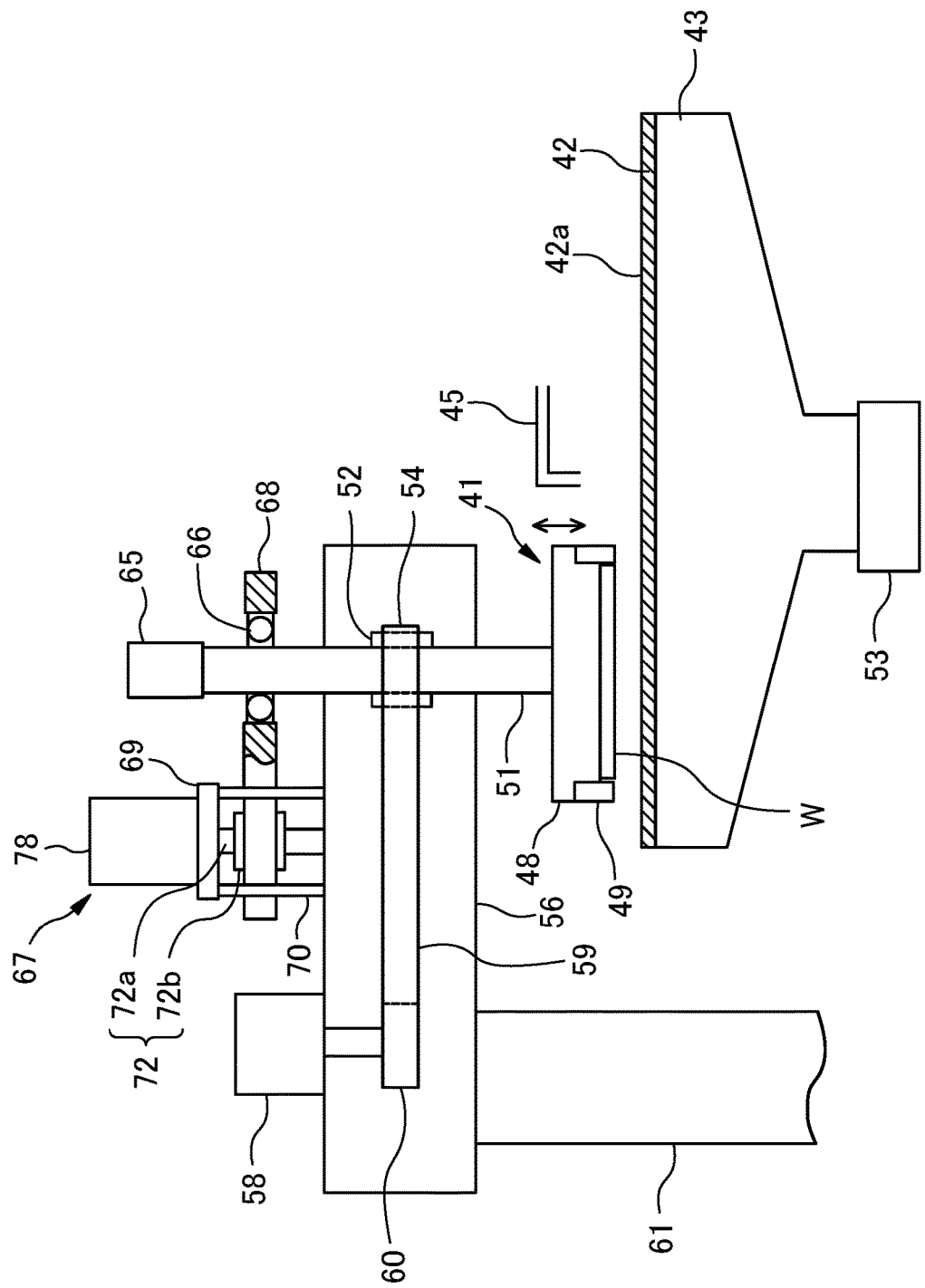
FIG. 3 is a front view showing an outline of a configuration of the substrate polishing unit.

FIG. 2 is a perspective view schematically showing the configuration of the polishing unit, and FIG. 3 is a side view schematically showing the configuration of the polishing unit. The polishing unit 40 includes a top ring (substrate holding device) 41 for holding and rotating a wafer (substrate) W, a polishing table 43 for holding the polishing pad 42, a polishing liquid supply nozzle 45 for supplying slurry (polishing liquid) to the polishing pad 42, and a film thickness sensor 47 for acquiring a signal that changes according to the film thickness of the wafer W.

The top ring 41 is configured to be able to hold a wafer W on the lower surface thereof by vacuum suction. The top ring 41 and the polishing table 43 rotate in a direction indicated by an arrow, and under this state, the top ring 41 presses the wafer W against a polishing surface 42a on an upper side of the polishing pad 42. In the presence of the polishing liquid supplied from the polishing liquid supply nozzle 45 onto the polishing pad 42, the wafer W is in sliding contact with the polishing pad 42 to be polished.

For example, an optical sensor or an eddy current sensor is used as the film thickness sensor 47, and the film thickness sensor 47 is installed inside the polishing table 43. During polishing of the wafer W, the film thickness sensor 47 rotates with the polishing table 43 and acquires a film thickness signal corresponding to the film thickness when crossing the surface of the wafer W. The film thickness signal from the film thickness sensor 47 is transmitted to the control device 15, and the film thickness device 15 finishes the polishing of the wafer W when the film thickness of the wafer W indicated by the film thickness signal reaches a set value.

In FIG. 3, the top ring 41 includes a head main body 48 for pressing the wafer W against the polishing surface 42a, and a retainer ring 49 for supporting the outer peripheral portion of the wafer W to prevent the wafer W from getting out of the top ring 41. The top ring 41 is connected to a top ring shaft 51, and a rotary joint 55 is fitted to an upper end of the top ring shaft 51. The top ring shaft 51 is configured to move up and down relative to a head arm 56 by an up-and-down movement mechanism 57, and is adapted to move and position the entire top ring 51 up and down with respect to the head arm 26.

The up-and-down movement mechanism 67 for moving the top ring shaft 51 and the top ring 41 up and down includes a bridge 68 for rotatably supporting the top ring shaft 51 via a bearing 66, a ball screw 72 fitted to the bridge 68, and a support stand 69 supported by support poles 70, and a servomotor 78 provided on the support stand 69. The support stand 69 for supporting the servomotor 78 is fixed to the head arm 56 via the support poles 70.

The ball screw 72 includes a screw shaft 72a connected to the servomotor 78 and a nut 72b with which the screw shaft 42a is threaded. The top ring shaft 51 is adapted to move up and down integrally with the bridge 68. Therefore, when the servomotor 78 is driven, the bridge 68 moves up and down via the ball screw 78, whereby the top ring shaft 51 and the top ring 41 move up and down.

The top ring shaft 51 is connected to a rotary cylinder 52 via a key (not shown). The rotary cylinder 52 is provided with a timing pulley 54 on an outer peripheral portion thereof. A head motor 58 is fixed to the head arm 56, and the timing pulley 54 is connected to a timing pulley 60 provided to the head motor 58 via a timing belt 59. By rotationally driving the head motor 58, the rotary cylinder 52 and the top ring shaft 51 rotate integrally via the timing pulley 60, the timing belt 59, and the timing pulley 54, whereby the top ring 11 rotates. The head arm 56 is supported by an arm shaft 61 which is rotatably supported by a frame (not shown). The operation of each of parts in the device including the head motor 58 and the servomotor 78 constituting the polishing apparatus is controlled by the control device 15.

The head arm 56 is configured to be pivotable about the arm shaft 61, and the top ring 41 holding the wafer W on the lower surface thereof is moved from a reception position of the wafer W to a polishing position above the polishing table 52 by the pivoting of the head arm 56. The top ring 41 and the polishing table 42 are respectively rotated, and a polishing liquid is supplied from the polishing liquid supply nozzle 45 onto the polishing pad 42. Under this state, the top ring 41 is moved down to a predetermined position (height), and the wafer W is pressed against the polishing surface 42a of the polishing pad 42 at this predetermined position, whereby the wafer W is brought into sliding contact with the polishing surface 42a, and the surface of the wafer W is polished.

Figure 4:
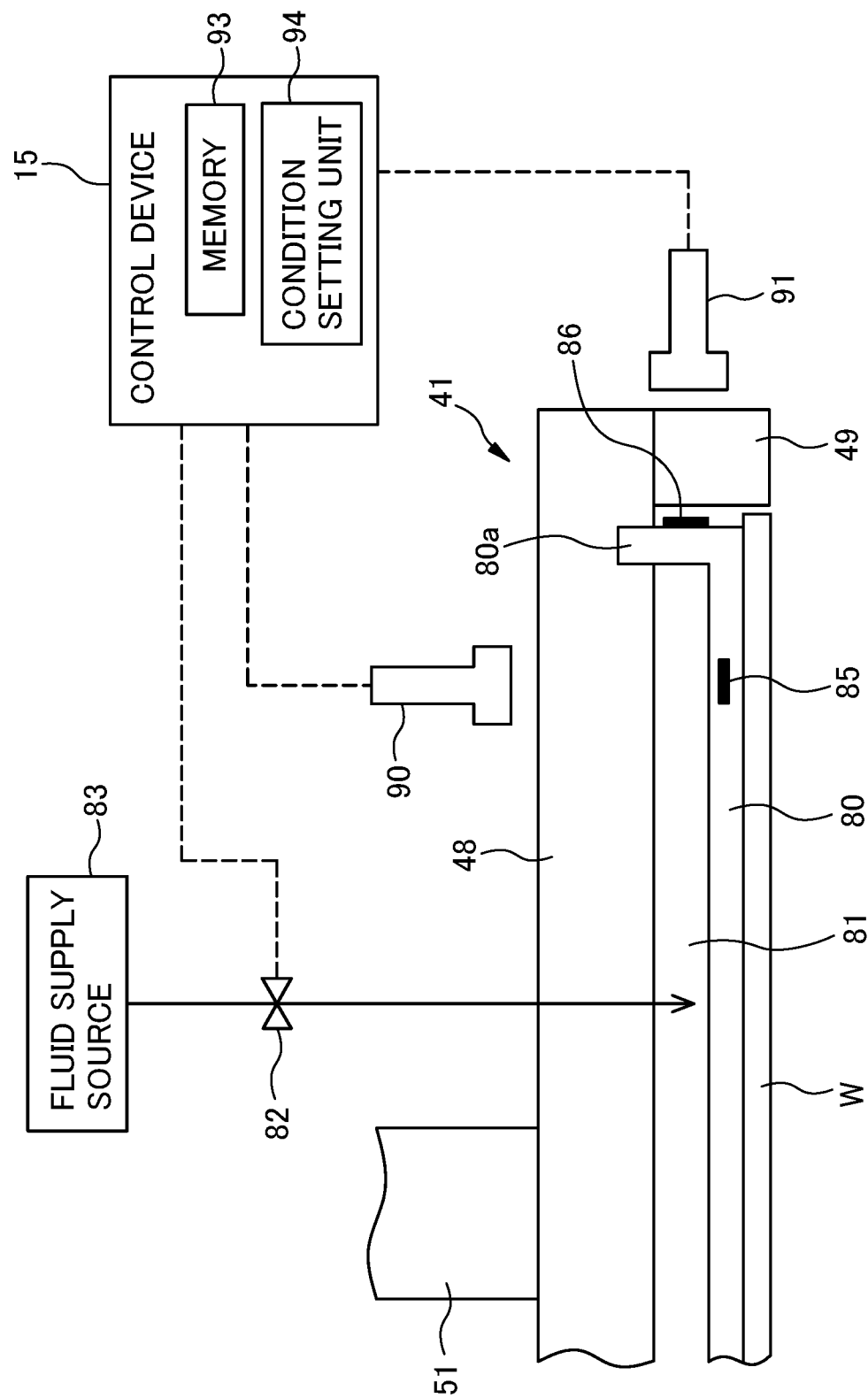
FIG. 4 is a side view of an essential part of the substrate polishing unit.

In FIG. 4, the top ring main body 48 and the retainer ring 49 which constitute the top ring 41 are configured to rotate integrally with each other by rotation of the top ring shaft 51. An elastic membrane (membrane) 80 in contact with the back surface of the wafer W is attached to the lower side of the top ring, and the lower surface of the elastic membrane 80 constitutes a substrate holding surface. The elastic membrane 80 has an annular partition wall 80a extending in a vertical direction, whereby a pressure chamber 81 is formed between the elastic membrane 80 and the top ring main body 48.

The pressure chamber 81 is connected to a fluid supply source 83 via a valve 82, and supplied with a pressurized fluid (gas) from the fluid supply source 83. The control device 15 is connected to the valve 82, whereby the internal pressure of the pressure chamber 81 can be adjusted, and a negative pressure can also be formed in the pressure chamber 82. Furthermore, the pressure chamber 81 is connected to an atmosphere opening mechanism (not shown), which also makes it possible to open the pressure chamber 81 to the atmosphere.

The elastic membrane 80 has a through-hole (not shown) at a position corresponding to the inside pressure chamber 81, and by forming a negative pressure in the through-hole, the wafer W can be held on the substrate holding surface of the elastic membrane 80. The elastic membrane 80 is formed of, for example, a rubber material having excellent strength and durability, such as ethylene propylene rubber (EPDM), polyurethane rubber or silicone rubber.

The retainer ring 49 is arranged so as to surround the top ring main body 48 and the elastic membrane 55. The retainer ring 49 is a ring-shaped member in contact with the polishing surface 42a of the polishing pad 42, is arranged so as to surround the outer peripheral edge of the wafer W held by the top ring main body 48, and supports the outer peripheral edge of the wafer W so that the wafer W under polishing does not get out from the top ring 41.

The upper surface of the retainer ring 49 is connected to an annular retainer ring pressing mechanism (not shown) to apply a uniform downward load onto the entire upper surface of the retainer ring 49. As a result, the lower surface of the retainer ring 49 is pressed against the polishing surface 42a of the polishing pad 42.

The elastic membrane 80 is provided with sensors 85 and 86 having a communication function. One sensor 85 is provided in the neighborhood of a portion of the elastic membrane 80 which is in contact with the wafer W, and the other sensor 86 is fitted to the side wall 80a of the elastic membrane 80. In the present embodiment, the sensor 85 is provided so as to be embedded inside the elastic membrane 80, but the position where the sensor 85 is arranged is not particularly limited as long as the sensor 85 is not in contact with the wafer W. For example, the sensor 85 may be arranged on an opposite surface (upper surface in FIG. 4) of the elastic membrane 80 to a side on which the elastic membrane 80 is in contact with the wafer W.

Figure 5:
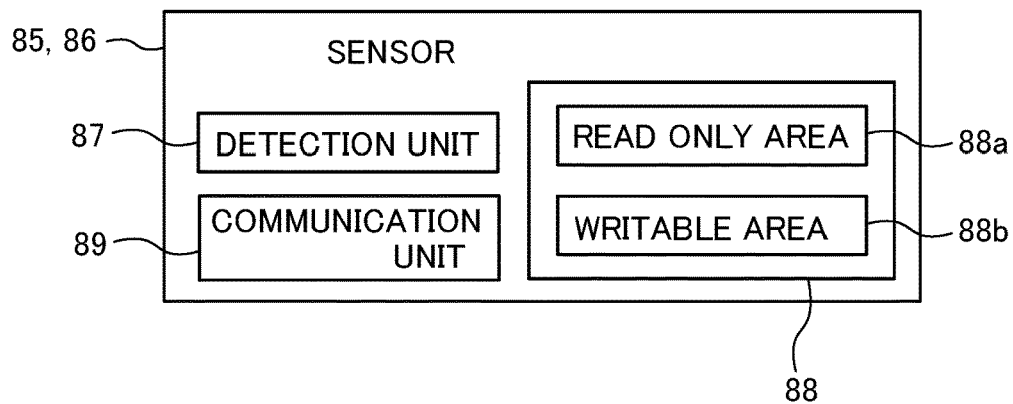
FIG. 5 is a block diagram showing a configuration of a sensor.

As shown in FIG. 5, the sensor 85, 86 includes a detection unit 87, a memory 88, and a communication unit 89. The detection unit 87 is, for example, a strain sensor that detects a strain amount applied to the sensor and outputs the detected strain amount as strain information. In the present invention, the sensor is not limited to the strain sensor, and for example, a temperature sensor, an acceleration sensor, or a tilt sensor can be used.

The memory 88 is provided with a read only area 88a in which predetermined data are stored in advance, and a writable area 88b which is readable and writable. In the read only area 88a is stored information such as a part number (part ID), a serial number, an expiration date, shipping inspection data, and manufacturing data of the elastic membrane 80 which is a consumable. Here, the shipping inspection data contains rubber physical property inspection data, exterior shape dimension data, and swelling measurement data of the elastic membrane, and the manufacturing data contains data of processing conditions such as press pressure, press temperature, press time, secondary vulcanization temperature and secondary vulcanization time.

Data of strain information detected by the detection unit 87 and wafer processing data are recorded in the writable area 88b. Here, the wafer processing data contains information on a use start date, a last use date, an integrated number of processed wafers, and an integrated processing time of the substrate processing on the elastic membrane 80 after replaced.

The communication unit 89 is, for example, a wireless communication module, and performs reading processing of data stored in the read only area 88a and the writable area 88b with detectors 90 and 91 (see FIG. 4) provided in the substrate processing apparatus 10. The detector 90, 91 is a communication module capable of performing wireless communication with the communication unit 89, and is movable between a reading position where the detector 90, 91 is located in the neighborhood of the corresponding sensor 85, 86, and a standby position where the detector 90, 91 is retracted from a movement area of the top ring 41. The detector 90, 91 moves to the reading position at a timing when the substrate processing is not performed by the substrate processing apparatus 10, and transmits/receives data to/from the sensor 85, 86.

The control device 15 is directly connected to the detectors 90 and 91 via wires or wirelessly, and provided with a memory 93 for storing various data read out from the sensors 85 and 86, and a condition setting unit 94 for setting a substrate processing condition (recipe and machine constant) based on shipment inspection data and manufacturing data read out from the sensors 85 and 86. Programs for controlling the operations of respective components of the substrate processing apparatus 10 including the detectors 90 and 91 and the condition setting unit 94 are stored in the memory 93 of the control device 15, and read out at the time when the substrate processing apparatus 10 operates, thereby controlling the operation of the substrate processing apparatus 10. Note that the control device 15 and the detectors 90 and 91 may be connected via the Internet or another communication device.

When the elastic membrane 80 to which the sensors 85 and 86 are fitted is attached to the substrate processing apparatus 10, or at a predetermined timing when the substrate polishing process is not performed, a zero point adjustment is performed on the sensors 85 and 86. For example, the control device 15 can detect outputs from the sensors 85 and 86 in a state where no load (pressure) is applied to the elastic membrane 80 or a state where a predetermined pressure is applied, and set the outputs of the sensors at that time as zero-point.

Figure 6:
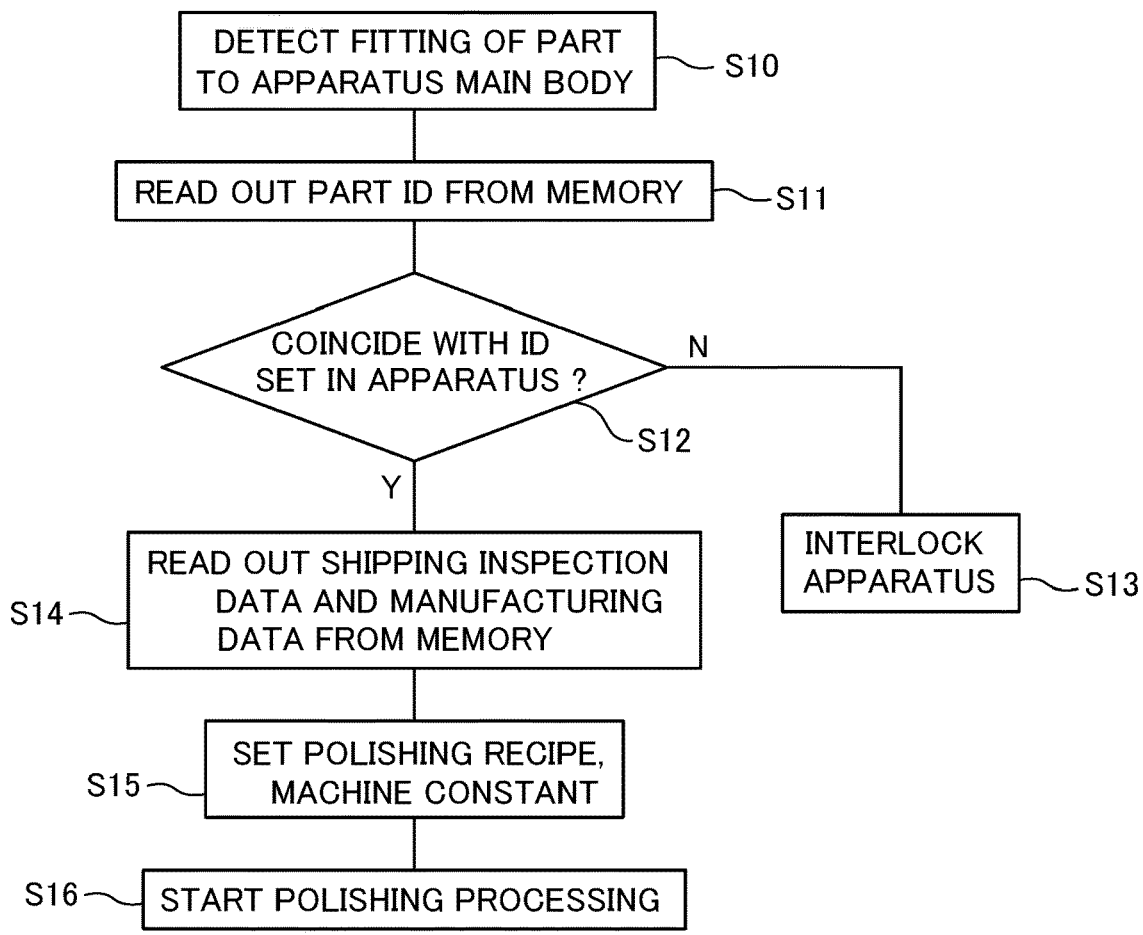
FIG. 6 is a flowchart showing a flow of matching processing of consumables.

FIG. 6 is a flowchart showing the procedure of matching processing when the elastic membrane 80 to which the sensors 85 and 86 are fitted is attached to the substrate processing apparatus 10. When the control device 15 of the substrate processing apparatus 10 detects that the elastic membrane 80 as a consumable is attached to the device main body by repair, replacement or the like (step S10), the control device 15 drives either or both of the detectors 90 and 91, and reads out the part ID (part number) stored in the corresponding sensor 85, 86 (step S11).

The control device 15 determines whether the read-out part ID is coincident with a part ID prestored in the memory 93 in the substrate processing apparatus 10 (step S12). Then, when the read-out part ID does not coincide with any of the part IDs stored in the memory 93 (for example, when an elastic membrane unadaptable to the substrate processing apparatus 10 is erroneously set, when a non-regular product is set), the control device 15 interlocks the substrate processing apparatus 10 so that the substrate polishing processing cannot be performed in the polishing unit 40 using the elastic membrane (step S13).

On the other hand, when the read-out part ID is coincident with any one of the part IDs stored in the memory 93, the control device 15 reads out shipping inspection data and the manufacturing data of the elastic membrane 80 stored in the memory 88, and stored these data into the memory 93 in the control device 15 (step S14). Then, the control device 15 sets a recipe of substrate polishing and a machine constant of the device based on various data read out from the memory 88 (step S15). Thereafter, the control device 15 drives the polishing unit to start the polishing processing on the wafer W (step S16).

Figure 7:
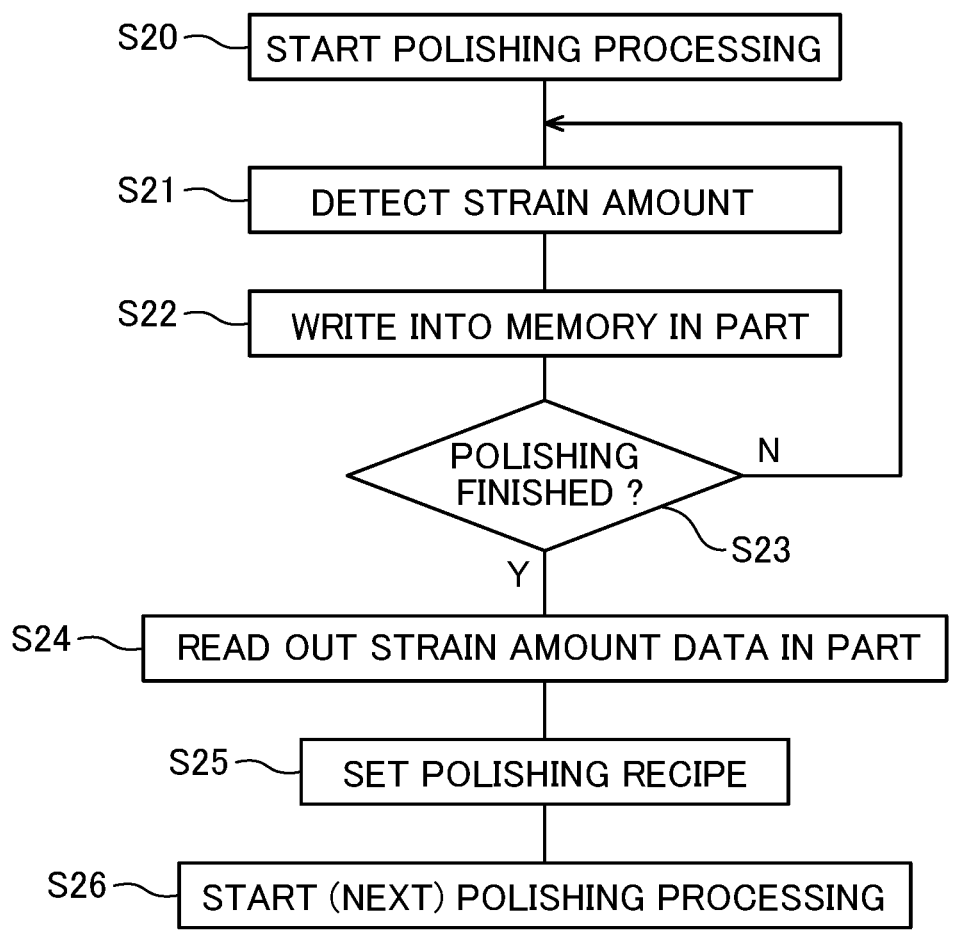
FIG. 7 is a flowchart showing a flow of data writing processing during polishing of a substrate.

FIG. 7 is a flowchart showing the operation of the substrate polishing processing. When the substrate polishing processing is started (step S20), the sensors 85 and 86 detect the amount of strain occurring in the elastic membrane 80 every predetermined time during polishing (step S21), and record the detected amount of strain as strain amount data into the writing area 88b of the memory 88 (step S22). Then, the control device 15 determines whether the polishing processing of the substrate is completed (step S23), and when the polishing processing is completed, the control device 15 drives the detectors 90 and 91 to read out the strain amount data stored in the memory 88 of the elastic membrane 80 and stores the strain amount data into the memory 93 in the control device 15 (step S24).

Based on the read-out strain amount data, the control device 15 sets a polishing recipe to be applied when a next wafer W is polished (step S25). For example, the control device 15 calculates an elongation amount of the elastic membrane 80 from the read-out strain amount data, and performs correction by using the rubber physical property inspection data, the exterior shape dimension data, and the swelling measurement data read out when the elastic membrane 80 is set, whereby the polishing recipe can be set. Thereafter, the control device 15 drives the polishing unit to start the polishing processing on the wafer W (step S26).

In the flowchart of FIG. 7, the setting of the polishing recipe to be used when the next wafer W is polished is performed based on the strain amount data, but the present invention is not limited to this manner. For example, when the strain amount fluctuates from a set value, the pressure in the pressure chamber 81 may be adjusted by adjusting the opening amount of the valve 82 so that the strain amount is approached to the set value. The strain amount data recorded in the memories 88 of the sensors 85 and 86 may be erased when the strain amount data are read by the control device 15, whereby the data capacity in the memory 88 can be suppressed.

Figure 8:
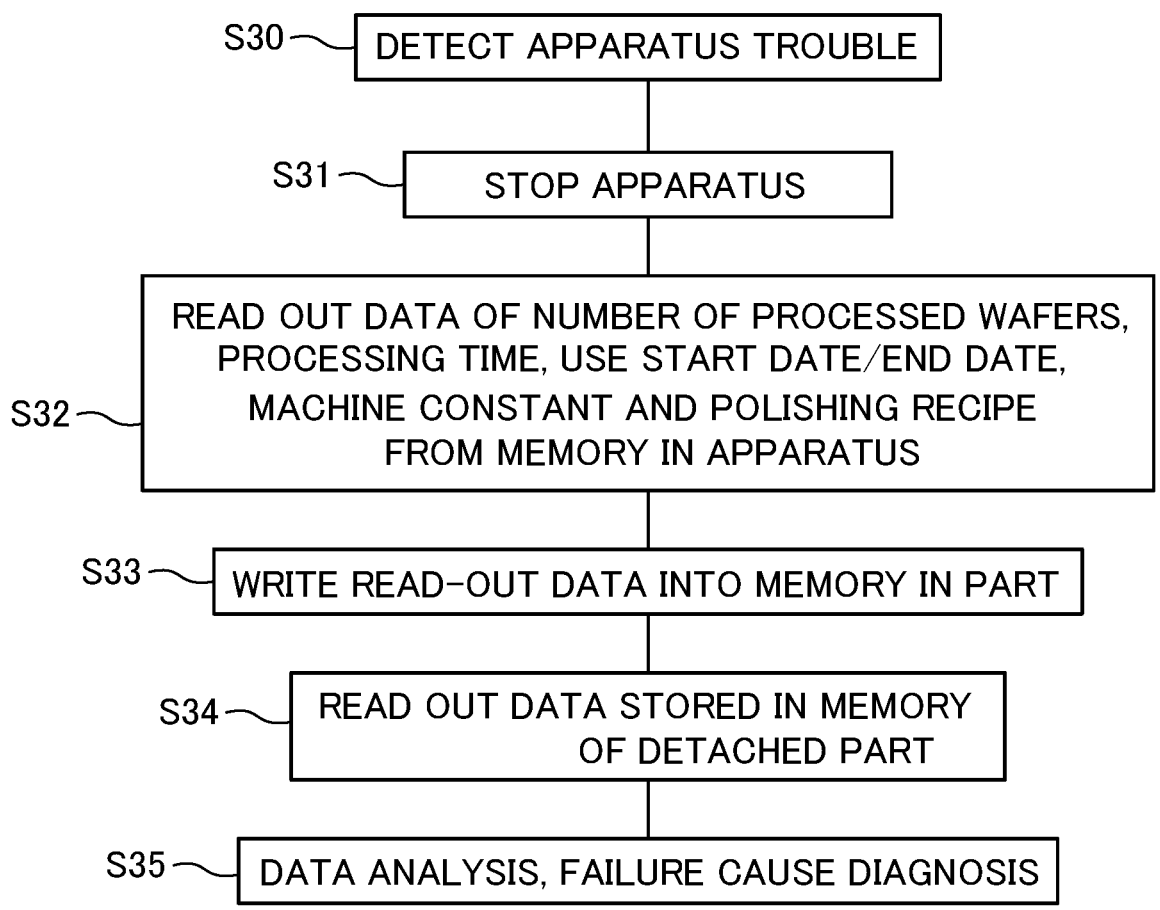
FIG. 8 is a flowchart showing a flow of data writing processing when an abnormality occurs in a device.

FIG. 8 is a flowchart showing a processing procedure when a trouble such as defective polishing performance (e.g., abnormality in polishing rate, abnormality in polishing profile, abnormality in planarity of a pattern on a wafer), slip-out of a wafer, or breakage of a wafer occurs in the substrate processing apparatus 10.

When detecting that some trouble has occurred in the polishing unit (step S30), the control device 15 immediately terminates the polishing processing being currently executed and stops the operation of the substrate processing apparatus (step S31). Subsequently, the control device 15 drives the detectors 90 and 91, reads out, from the memory in the control device 15, various information (for example, information on the number of processed wafers, a processing time, which are counted in the device main body, use start and end dates, a machine constant and a recipe) from the memory 93 in the device (step S32), and writes the information into the memories 88 in the sensors 85 and 86 fitted to the elastic membrane 80 (step S33).

Thereafter, the lock of the top ring 41 is released, and the elastic membrane 80 is removed from the top ring 41. The removed elastic membrane 80 is set in an off-line reader (not shown), and the various information written in step S33 and the strain amount data during the substrate polishing processing which have been recorded in the memories 88 are read out from the memories 88 in the sensors 85 and 86 fitted to the elastic membrane 80 (step S34). As a result, by analyzing the read-out various information and strain amount data, it is possible to diagnose the cause of failure (step S35). Note that when the cause of failure is diagnosed, the rubber physical property, the exterior shape dimension, and the swelling of the removed elastic membrane 80 may be inspected.

In the above embodiment, the operation of the sensors 85 and 86 when the elastic membrane as a consumable is attached, when the polishing processing is performed and when a trouble occurs has been described. However, the present invention is not limited to these cases, and for example, as shown in FIG. 9, the present invention can also be applied when the wafer W after the polishing processing is removed from the elastic membrane.

Figure 9:
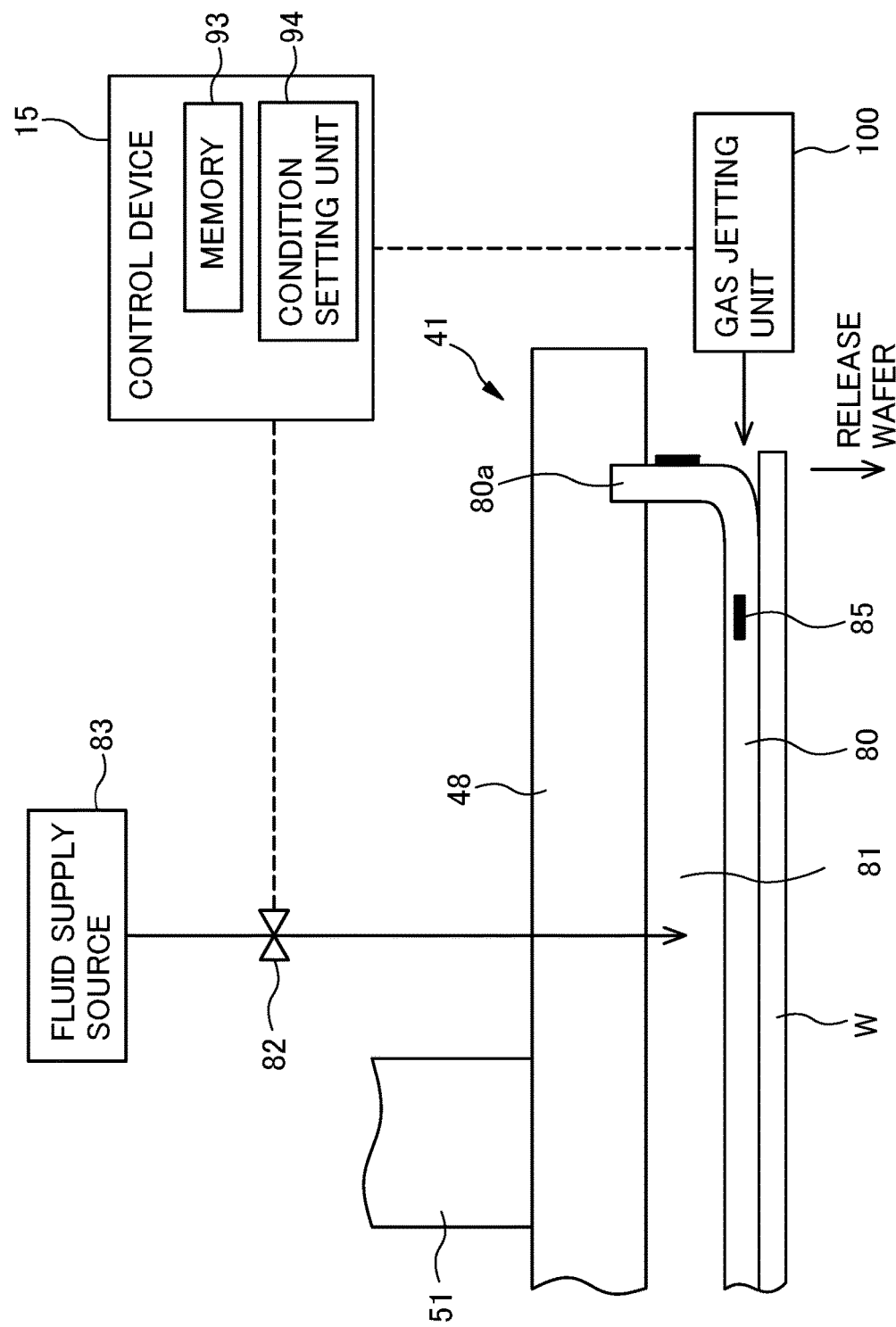
FIG. 9 is an explanatory diagram showing a state where a wafer on which polishing processing has been finished is released from a top ring by jetting gas to the wafer.

In FIG. 9, a gas jetting unit 100 connected to the control device 15 is arranged in the vicinity of the top ring 41. Since the wafer W just after the polishing processing is adsorbed to the elastic membrane 80, it would be impossible to release the wafer W from the elastic membrane 80 without taking any action. Therefore, the gas jetting unit 100 jets, for example, non-volatile gas to a neighborhood of a joint portion between the wafer W and the elastic membrane 80 (a swelled portion in the neighborhood of the sidewall portion of the elastic membrane) at a predetermined timing after the polishing processing is finished. As a result, the wafer W for which the polishing processing has been finished can be released from the elastic membrane 80. Note that liquid (pure water) may be jetted instead of gas.

Here, the position of the swelling portion of the elastic membrane 80 (the position in the vertical direction in the figure) is not constant at all times, and varies according to the manufacturing condition of the elastic membrane, the rubber physical property inspection data, the exterior shape dimension data, the number of processed substrates, the processing time, the pressure in the pressure chamber 81, etc. When the gas from the gas jetting unit 100 is jetted to a position deviated from the boundary between the elastic membrane 80 and the substrate, the wafer W for which the polishing processing has been finished cannot be easily detached from the elastic membrane 80.

Therefore, in the case where the wafer W is released from the elastic membrane after the polishing processing has been finished, the strain amount is detected by the sensors 85 and 86, and the control device 15 drives the valve 82 to stop supply of fluid from the fluid supply source 83 when the strain amount detected by these sensors reaches a set value in the control device 15. As a result, when the wafer W is released from the elastic membrane after the polishing processing has been finished, the pressure in the pressure chamber 81 becomes constant, and the position of the swelling portion of the elastic membrane 80 becomes constant, so that the gas from the gas jetting unit 100 can be surely applied to the boundary between the elastic membrane 80 and the wafer W.

Figure 10:
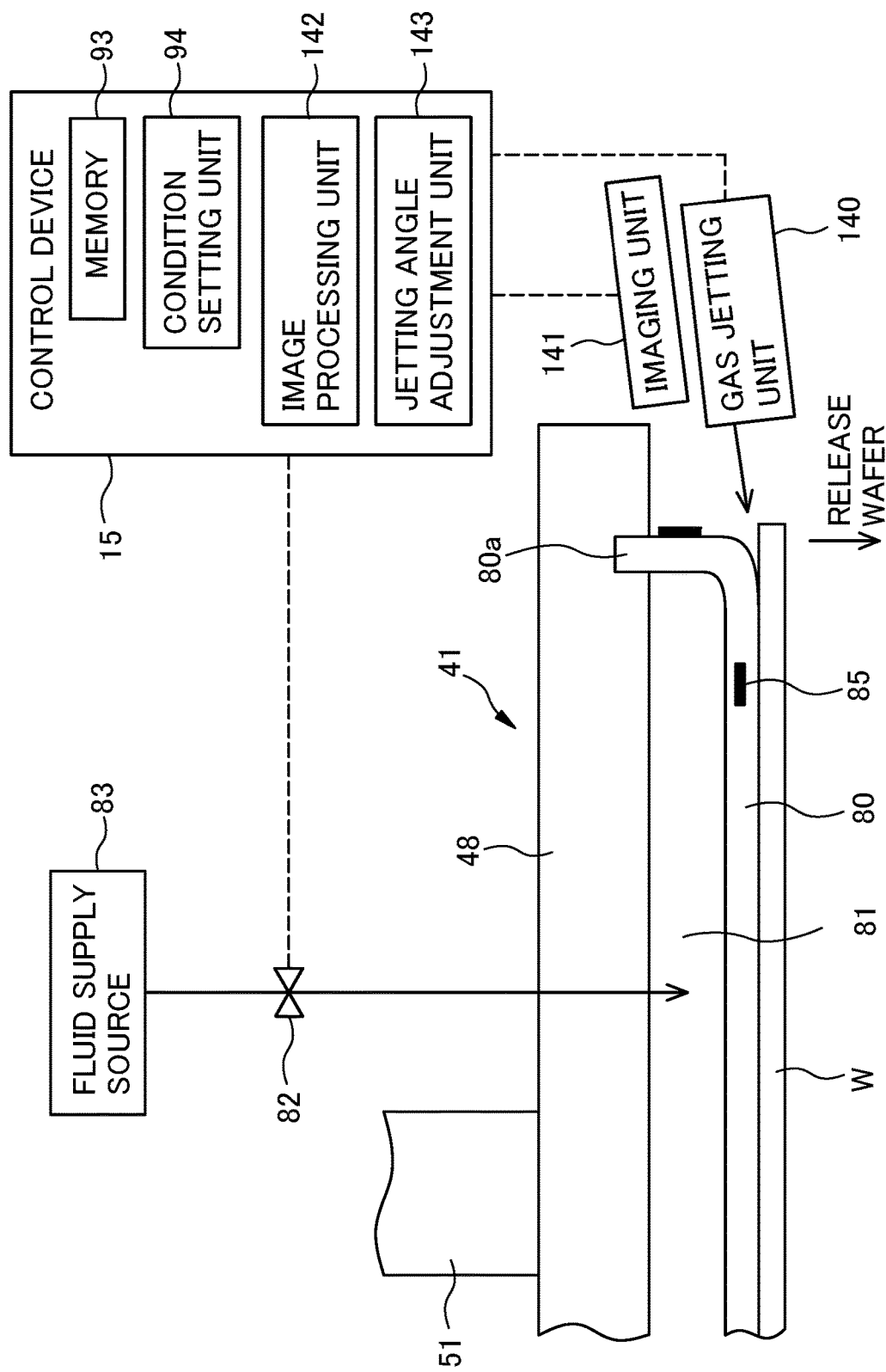
FIG. 10 is an explanatory diagram showing another example of a state where a wafer on which the polishing processing has been finished is released from the top ring by jetting gas to the wafer.

FIG. 10 shows another example of the configuration for releasing the wafer W after the polishing processing from the elastic membrane. In FIG. 10, a gas jetting unit 140 and an imaging unit 141 which are connected to the control device 15 are arranged in the neighborhood of the top ring 41. The jetting angle of the gas jetting unit 140 is adjustable, and the imaging unit 141 images a boundary portion between the wafer W and the elastic membrane. An image captured by imaging is sent to an image processing unit 142 in the control device 15. The image processing unit 142 detects the position of the boundary portion between the wafer W and the elastic membrane (a position in a direction in which the wafer W is released from the elastic membrane in the figure) based on the image captured by the imaging unit 141. A jetting angle adjustment unit 143 determines a gas jetting angle of the gas jetting unit 140 based on information on the position of the boundary portion between the wafer W and the elastic membrane obtained in the image processing unit 142 and information on the installation position of the gas jetting unit 140, and adjusts the jetting angle of the gas jetting unit 140. As a result, the gas from the gas jetting unit 140 can be surely applied to the boundary between the elastic membrane 80 and the wafer W.

In the above embodiment, the example in which one sensor 85 is arranged within a plane of the elastic membrane 80 in parallel to the wafer W has been described. However, the present invention is not limited to this embodiment, and a plurality of sensors may be arranged to detect strain amounts at a plurality of places of the elastic membrane. As a result, when the wafer W is released from the elastic membrane after the polishing processing has been finished, it is possible to more accurately measure the pressure actually applied to the wafer.

Figure 11:
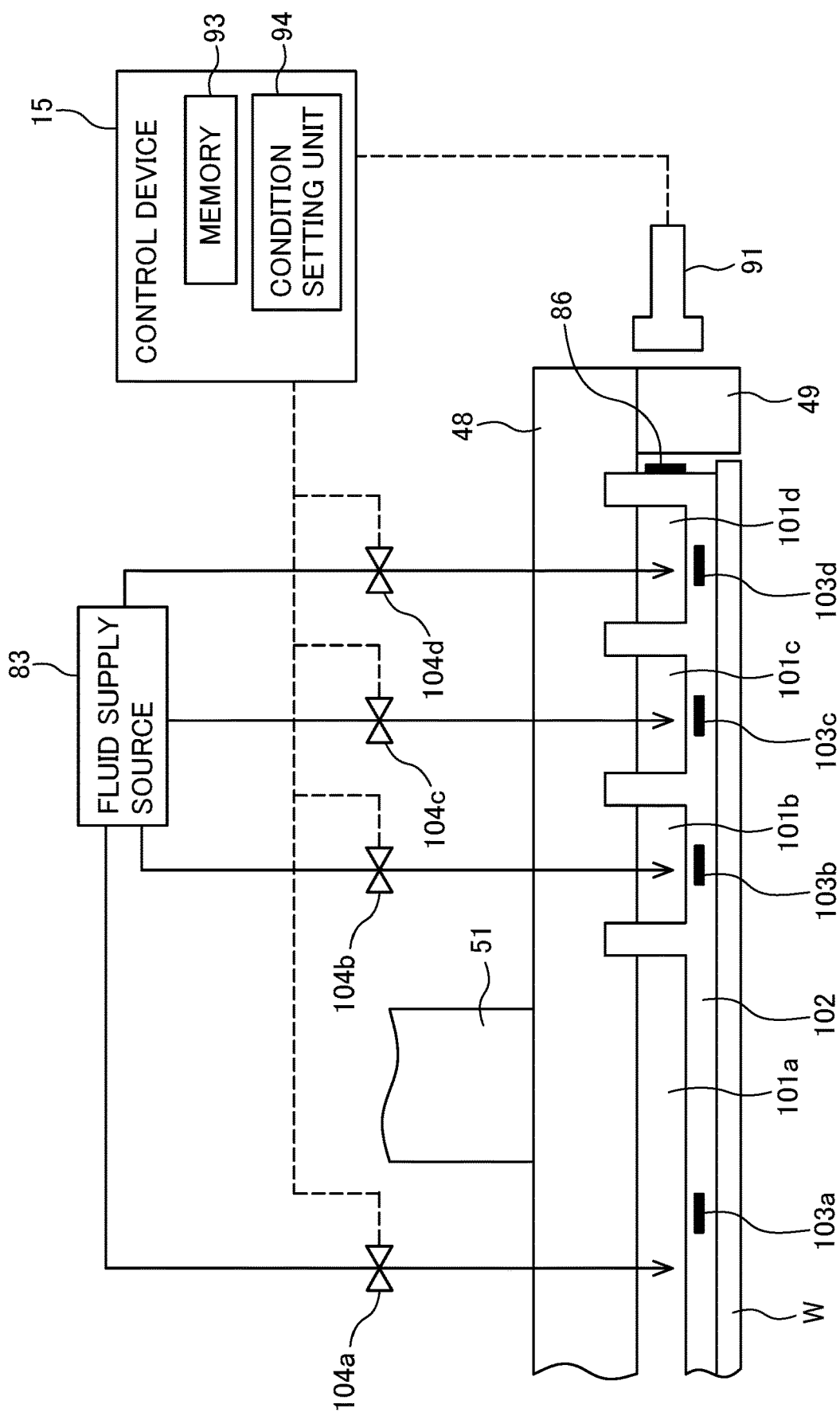
FIG. 11 is an explanatory diagram showing an example of an arrangement of sensors.

Furthermore, as shown in FIG. 11, an elastic membrane 102 may be provided so as to form a plurality of pressure chambers 101a to 101d between the elastic membrane 102 and a top ring 41, and a plurality of sensors 103a to 103d may be provided at positions corresponding to the respective pressure chambers. As a result, valves 104a to 104d connected to the fluid supply source 83 are controlled so that the strain amounts detected by the respective sensors 103a to 103d are constant, whereby the actual pressure onto the wafer W from the respective pressure chambers 101a to 101d can be adjusted to be uniform.

Figure 12:
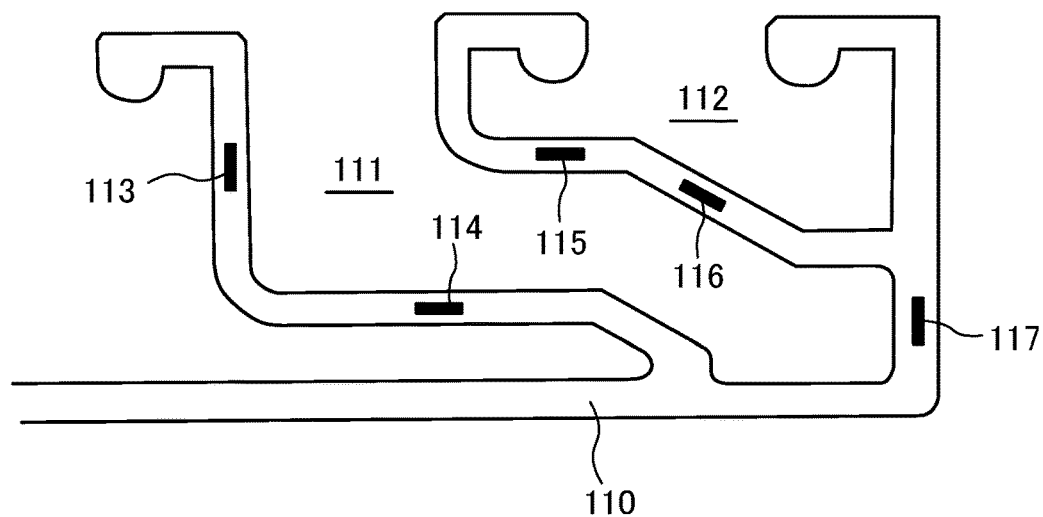
FIG. 12 is an explanatory diagram showing another example of the arrangement of the sensors.
Figure 13:
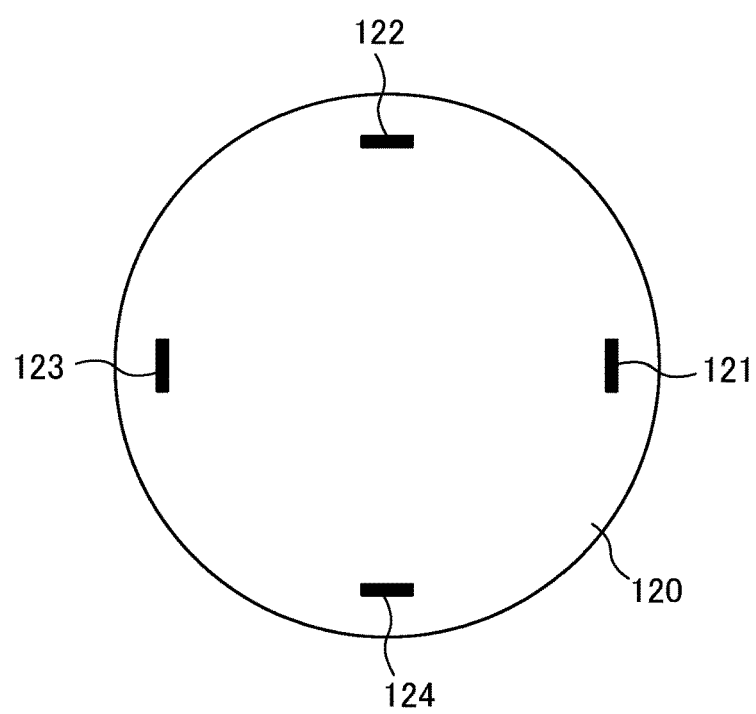
FIG. 13 is an explanatory diagram showing another example of the arrangement of the sensors.

The shape of the elastic membrane to be applied to the present invention is not particularly limited, and for example, a plurality of sensors 113 to 117 may be arranged so as to correspond to an elastic membrane 110 having pressure chambers 111 and 112 on two stages in the vertical direction as a shown in FIG. 12. Further, as shown in FIG. 13, a plurality of sensors 121 to 124 may be arranged along the peripheral direction of the elastic membrane 120. As a result, an elongation distribution of the elastic membrane can be accurately detected.

Figure 14:
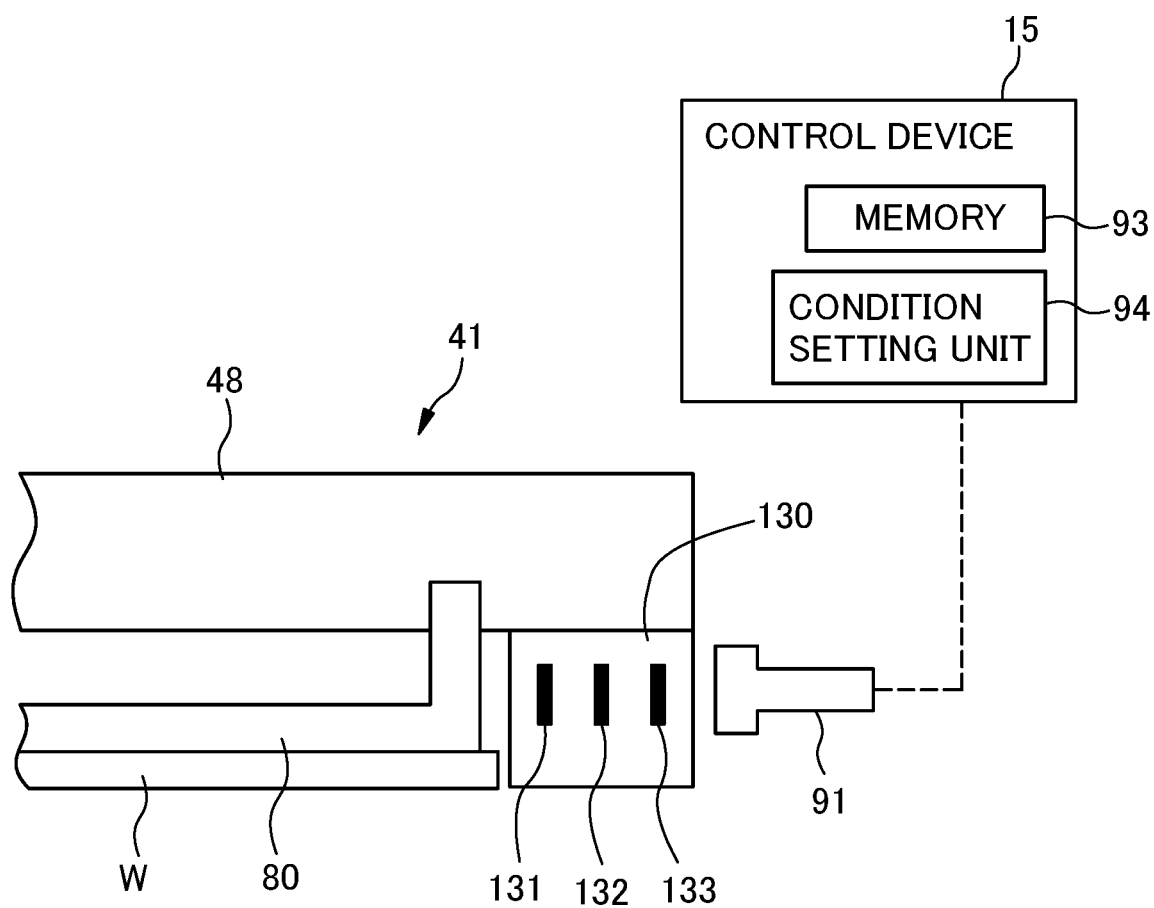
FIG. 14 is an explanatory diagram showing an embodiment in which sensors are attached to a retainer ring.

In the above embodiment, the example in which the sensors are provided to the elastic membrane has been described. However, the present invention is not limited to this embodiment, and for example, the sensor may be arranged in the retainer ring as shown in FIG. 14. In FIG. 14, three sensors 131 to 133 are embedded in the retainer ring 130, and as in the case of the embodiment described above, these sensors 131 to 133 detect the amounts of strain suffered during the polishing processing, and receive and transmit various information from and to the control device 15 through the detector 91.

Here, when the polishing processing is about to be performed immediately after the retainer ring 130 is exchanged, only an inner end portion of the retainer ring 130 is excessively pressed against the polishing pad 42 as shown in FIG. 15(a), and thus a distribution occurs in compressive force which the retainer ring 130 receives, so that the side surface of the wafer W cannot be properly supported. Therefore, in prior arts, polishing processing using a formal wafer W is performed after test polishing by using a predetermined number of (for example, 25 to 30) dummy wafers (break-in processing).

On the other hand, since the plurality of sensors 131 to 133 are embedded in the retainer ring 130 according to present embodiment, the strain amounts detected by the plurality of sensors 131 to 133 can be monitored when the polishing processing using dummy wafers is performed. As shown in FIG. 15(b), when the deviations of the strain amounts (arrows in the figure) from the sensors 131 to 133 are within a predetermined value, the test polishing using the dummy wafers is finished, whereby the break-in processing can be surely performed regardless of the differences in the material of the retainer ring and the polishing condition.

In the above embodiment, the break-in processing is controlled by using a plurality of strain sensors provided in the retainer ring 130, but the present invention is not limited to this embodiment. For example, the substrate processing condition such as the pressure in the elastic membrane may be appropriately changed in accordance with variation of the strain information of the plurality of strain sensors.

In the control device, information on the type of a consumables such as the elastic membrane or the retainer ring, replacement time and strain measurement frequency may be acquired in advance, and the date and time of maintenance of the substrate processing apparatus (or a period of time until maintenance) may be calculated based on these information, and output for display. As a result, an operator can properly grasp the timing of maintenance of the device.

Furthermore, the control device may be configured to automatically order consumables such as the elastic membrane and the retainer ring when the calculated maintenance date and hour has approached (for example, several days ago), whereby the consumables can be surely prepared at the time of maintenance. Note that a program for causing the control device to calculate the date and time of maintenance or order consumables may be stored in advance in the memory of the control device, or may be installed later via the Internet or the like.

The control device may be provided with a communication function, and configured to be connectable to an external server via a network to transmit various kinds of information such as an operation status of the device, strain data, and polishing environment information to the external server. Furthermore, the external server may be configured so as to standardize a control pattern of the substrate processing apparatus and automatically operate while adjusting polishing conditions such as the polishing pressure based on various data received from the control device. Furthermore, the external server may be configured to be connectable to another substrate processing apparatus via a network, and may share various information such as the operation status of the device, strain data, and polishing environment information.

Based on various information sent from the substrate processing apparatus and various information from another substrate processing apparatus, the external server connected to the control device via the network may perform abnormality detection, and prediction and determination of the lifetimes of the substrate processing apparatus and consumables used for the substrate processing apparatus, and may perform display of the abnormality detection and the lifetime. Furthermore, it is also possible to perform control for stabilization in the performance of the substrate processing apparatus in the external server.

In the control device or the external server, automatic learning by feature quantity extraction and automatic standardization of control patterns are performed for strain data and other output data sent from sensors, and prediction, determination, and display of abnormalities and lifetime may be performed. Furthermore, for example, standardization of format etc. may be performed in communication, equipment interface, etc., and may be used for information communication between the devices/equipment to perform management of apparatus/equipment.

In the above embodiment, the strain sensor is used to measure the elongation distribution of the consumable. However, the type of sensor is not limited. For example, a temperature sensor may be used to measure a temperature distribution, or may use a pressure sensor to measure a pressure distribution. Furthermore, plural types of sensors may be used in combination.

The above embodiment has been described by exemplifying the substrate polishing apparatus for polishing a wafer W, but the present invention is not limited to the above embodiment. For example, the present invention is likewise applied to a sponge (cleaning member) used as a consumable in a substrate cleaning device for cleaning a substrate after polishing processing.

The foregoing embodiment has been described so that those skilled in the art to which the present invention belongs can implement the present invention. Various modifications of the above-described embodiment can naturally be made by those skilled in the art, and the technical idea of the present invention can be applied to other embodiments. The present invention is not limited to the described embodiments and is construed in the broadest scope in accordance with the technical concept defined by the claims.

REFERENCE SIGNS LIST 10 substrate processing apparatus
15 control device
40 polishing unit
41 top ring
48 head main body
49,130 Retainer ring
80, 102, 110, 120 Elastic membrane
85, 86, 103a to 103d, 113 to 117, 121 to 124, 131 to 133 Sensor
90, 91 detector
W wafer

The invention claimed is:

1. A substrate processing apparatus for processing a substrate, comprising:
   a polishing pad for polishing the substrate;
   a substrate holding unit for holding the substrate and pressing the substrate against the polishing pad;
   an elastic membrane that is attached to the substrate holding unit and holds a surface opposite to a polishing surface of the substrate;
   at least one strain sensor that is fitted to the elastic membrane, measures strain of the elastic membrane, and includes a storage unit for storing strain information and a communication unit;
   a detector that is provided in a neighborhood of the elastic membrane and reads and writes information from and into the strain sensor fitted to the elastic membrane; and
   a control device that is connected to the detector and sets a processing condition in the substrate processing apparatus based on the strain information of the elastic membrane read from the strain sensor; and
   a jetting unit configured to jet gas or liquid to a side wall of the elastic membrane at a boundary between the elastic membrane and the substrate in order to peel the polished substrate from the elastic membrane;
   wherein the control device adjusts pressure in a pressure chamber based on the strain information of the elastic membrane so that the gas or the liquid from the jetting unit is jetted to the boundary.

2. The substrate processing apparatus according to claim 1, wherein identification information of the sensor is stored in the storage unit, and the control device determines based on the identification information read from the sensor whether the driving substrate processing apparatus is possible.

3. The substrate processing apparatus according to claim 1, wherein when an abnormality occurs in the substrate processing apparatus, the control device records information on a processing condition of the substrate into the storage unit in the strain sensor.

4. The substrate processing apparatus according to claim 1, wherein the pressure chamber is formed between the elastic membrane and the substrate holding unit, and
   the control device adjusts the pressure in the pressure chamber based on the strain information of the elastic membrane measured by the strain sensor.

5. The substrate processing apparatus according to claim 1, wherein the jetting unit is configured so that a jetting angle of the gas or the liquid is adjustable, and wherein the substrate processing apparatus includes:
   an imaging unit for imaging a boundary portion between the elastic membrane and the substrate;
   an image processing unit for detecting a position of the boundary portion from an image obtained by the imaging unit; and
   a jetting angle adjustment unit for determining a jetting angle by the jetting unit based on the position of the boundary portion detected by the image processing unit to adjust the jetting angle.

* * * * *